United States Patent
Jang et al.

(10) Patent No.: US 12,249,501 B2
(45) Date of Patent: Mar. 11, 2025

(54) SUSCEPTOR MANUFACTURING METHOD AND THE MANUFACTURED SUSCEPTOR USING THE SAME

(71) Applicant: ASM IP Holding B.V., Almere (NL)

(72) Inventors: Hoyoun Jang, Hwaseong-si (KR); Gopu Krishna, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/674,025

(22) Filed: May 24, 2024

(65) Prior Publication Data
US 2024/0404779 A1    Dec. 5, 2024

Related U.S. Application Data

(60) Provisional application No. 63/469,575, filed on May 30, 2023.

(51) Int. Cl.
| | |
|---|---|
| *H01J 9/36* | (2006.01) |
| *H01J 9/24* | (2006.01) |
| *H01J 9/30* | (2006.01) |
| *H01J 9/34* | (2006.01) |
| *H01J 37/32* | (2006.01) |

(52) U.S. Cl.
CPC ............. *H01J 9/36* (2013.01); *H01J 9/245* (2013.01); *H01J 9/30* (2013.01); *H01J 37/32724* (2013.01)

(58) Field of Classification Search
CPC .......... H01J 9/36; H01J 9/30; H01J 37/32724
See application file for complete search history.

(56) References Cited

U.S. PATENT DOCUMENTS

| | | |
|---|---|---|
| 5,960,281 A | 9/1999 | Nam |
| 7,175,714 B2 | 2/2007 | Ootsuka |
| 7,211,154 B2 | 5/2007 | Ootsuka |
| 7,375,046 B2 | 5/2008 | Aihara |
| 7,901,509 B2 | 3/2011 | Mariner |
| 2008/0156441 A1 | 7/2008 | Ogasawara |
| 2020/0312693 A1* | 10/2020 | Nobori .............. H01L 21/67017 |

\* cited by examiner

*Primary Examiner* — Joseph L Williams
(74) *Attorney, Agent, or Firm* — Snell & Wilmer L.L.P.

(57) ABSTRACT

A method of providing a stable connector used in a deposition apparatus is presented. The method may include forming a dome-shaped electrode connector inside of a ceramic material, drilling out a part of the ceramic material along with a portion of the dome-shaped electrode connector to flatten the electrode connector, and bonding a rod into a remaining part of the electrode connector. The method would provide a stable electrode connector which could hold the entire length of the rod which is bonded onto it. The length of the flattened electrode connector could be 5 mm.

7 Claims, 4 Drawing Sheets

SUSCEPTOR MANUFACTURING METHOD AND THE MANUFACTURED SUSCEPTOR USING THE SAME

CROSS-REFERENCE TO RELATED APPLICATIONS

This application claims priority to U.S. Provisional Patent Application Ser. No. 63/469,575 filed May 30, 2023 titled A SUSCEPTOR MANUFACTURING METHOD AND THE MANUFACTURED SUSCEPTOR USING THE SAME, the disclosure of which is hereby incorporated by reference in its entirety.

FIELD OF INVENTION

The present disclosure relates to a susceptor, particularly to a susceptor manufacturing method and the manufactured susceptor using the method. The susceptor may be a component in a wafer processing apparatus using plasma for processing wafers.

BACKGROUND OF THE DISCLOSURE

In a wafer processing apparatus, a susceptor may be used to heat up and support the wafer during the process.

Below a wafer support, a rod may be connected to an electrode in the base and the electrode which is the connecting part from an RF mesh or heating element to the rod.

However, this electrode-rod connection may be degraded by heat expansion, cooling contraction, and physical stress, which might be caused by physical movement and the degradation may cause physical disconnection and/or loss of bonding between the electrode and the rod.

To minimize the risk of disconnection, it may be better to use a large electrode with a large contact area to the rod. When the electrode has a large contact area with the rod, the impedance in heat generation process would be reduced, strengthening the bond between the RF mesh or heating element to the rods.

However, a larger electrode would be harder to manufacture than a conventional electrode due to a much higher risk of getting cracks in vertices, especially while being sintered inside ceramic material.

Therefore, the present disclosure presents a method for manufacturing a larger electrode without cracks and the electrode manufactured from the method.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with one embodiment there may be provided, a method of providing a stable connector that connects a heating element to a rod in a deposition apparatus, the method comprising forming a dome-shaped electrode connector inside of a ceramic material; drilling out a part of the ceramic material along with a portion of the dome-shaped electrode connector to flatten the electrode connector; and bonding a rod into a remaining part of the electrode connector.

In at least one aspect, the length of the dome-shaped electrode connector is equal to or bigger than 5 mm.

In at least one aspect, the width of the rod is equal to or less than the length of the dome-shaped electrode connector.

In accordance with one embodiment there may be provided, a substrate processing apparatus with a stable electrode connecting space for connecting an electrode and a rod, the apparatus comprising: a chamber defined by a wall surrounding the chamber; a showerhead disposed on upside of the chamber; a susceptor configured to support a substrate, the susceptor comprising a plurality of radio frequency (RF) meshes, a plurality of heating elements, a rod and an electrode connector, wherein the rod is connected to the electrode connector and the width of the electrode connector is larger than the diameter of the rod.

In at least one aspect, the rod comprising a heating rod and an RF rod.

In at least one aspect, the RF rod is connected to the electrode connector.

In at least one aspect, the electrode connector is manufactured with a method defined above.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

FIG. 1 (a) to (c) illustrates in sequence how the electrode connector may be formed according to an embodiment of the present disclosure.

DETAILED DESCRIPTION OF EXEMPLARY EMBODIMENTS

Figure 1:
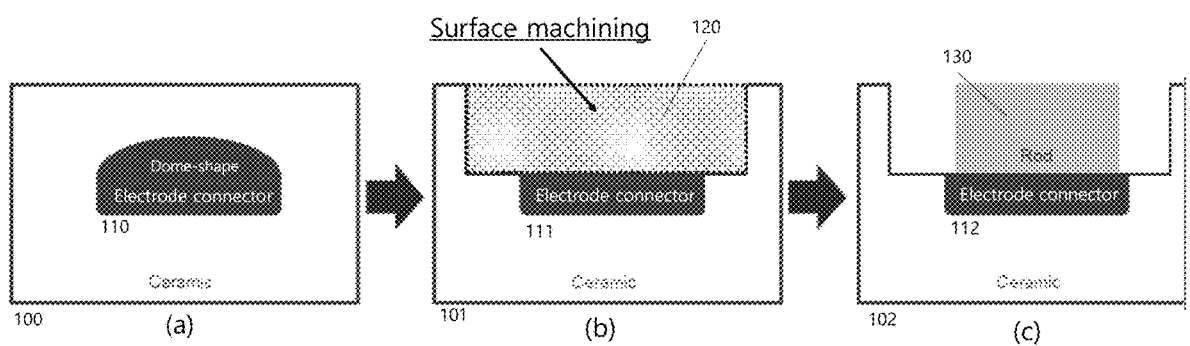

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

From FIG. 1 (*a*) to (*c*) illustrate how a connector embodiment is formed according to the present disclosure.

In FIG. 1 (*a*), an electrode connector 110 resides inside of a ceramic material 100. Usually, the ceramic material 100 locates below a wafer support (not illustrated) in a wafer processing apparatus The electrode connector 110 may have a dome shape according to the present disclosure.

For minimizing the risk of getting cracks, the present disclosure's electrode connector 110 may have a dome shape as shown in FIG. 1 (*a*).

The drilling or surface machining may take out a chunk of a ceramic material including the dome shape part 120 for a rod 130 to be bonded to the drilled-out electrode connector 112.

The top of the remaining part of the electrode connector 111 would be flattened by the drilling so that rod can be bonded onto the flattened surface.

FIG. 1 (*c*) illustrates attaching and bonding the rod 130 to the drilled electrode connector 112 in the ceramic material 102 according to an embodiment of the invention. The rod 130 and the electrode connector 112 are bonded with brazing using sheet type metal.

The length of the electrode connector 112 may at least be equal to or bigger than the width of the rod 130.

Figure 2:
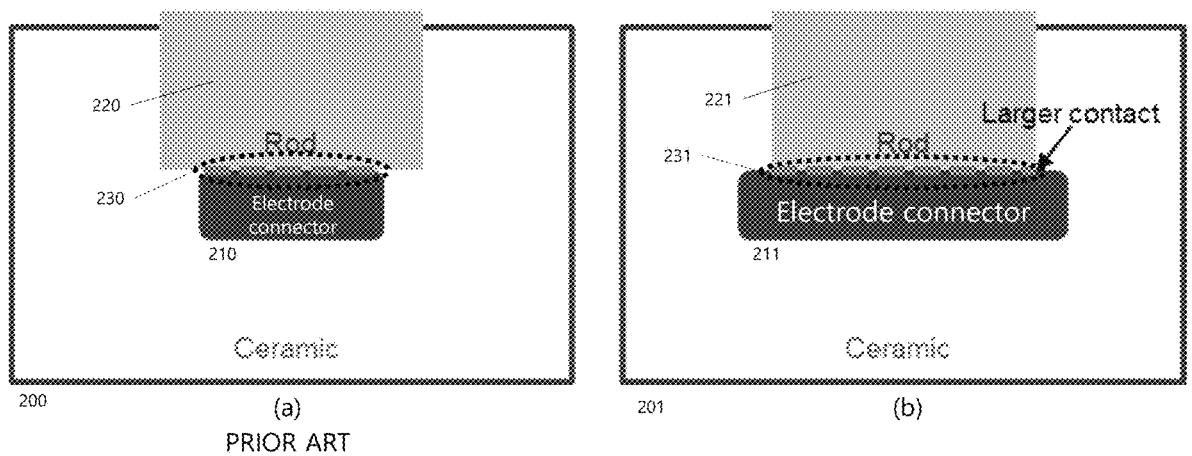
FIG. 2 (a) illustrates how a rod and a connector is bonding in a prior art; (b) illustrates how a rod and a connector is bonding according to an embodiment of the present disclosure.

FIGS. 2 (*a*) and (*b*) illustrate the comparison of the prior art and an embodiment of the present disclosure.

FIG. 2 (*a*) illustrates how a rod is bonded with an electrode connector in a prior art reference. And FIG. 2 (*b*) illustrates the same situation as in FIG. 1 (*c*) when the method according to the present disclosure is performed. As can be seen, the length of electrode connector 210 is not as large as that of the rod 220 so the length of contact area 230 may not contain the entire of the rod 220.

FIG. 2 (*b*) illustrates the contact area 231 to be a lot longer (larger contact) than the counterpart of its prior art in FIG. 2 (*a*) and may well contain enough of the length of the rod 221. As stated above, the bonding method between the rod 221 and the electrode connector 231 is brazing with a sheet type metal, such as Au filler.

As the length of the electrode connector 211 may be longer than that of the rod 221 in larger contact 231, the bonding may be stronger than that of 230 and the impedance would be smaller than that of 230 (due to the larger contact area). This could reduce the probability of getting physical and thermal stress it would get from the heating and moving it would get during wafer processing.

Figure 3:
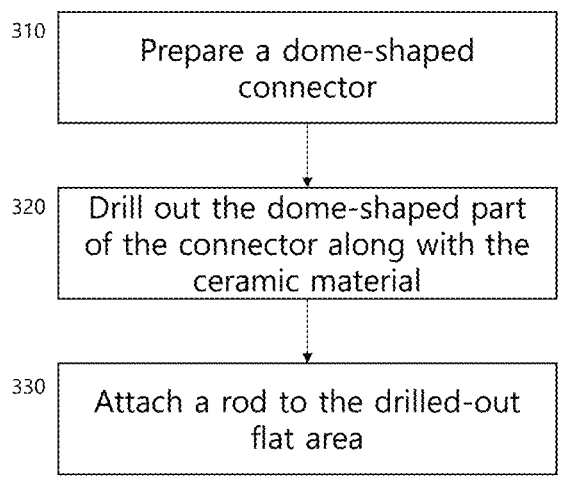
FIG. 3 illustrates a flow chart of the sequence how a rod-connector bonding forms according to an embodiment of the present disclosure.

FIG. 3 illustrates the flow chart of the method according to an embodiment of the present disclosure.

An electrode connector may be prepared to have a dome shape in a ceramic material (310). As explained previously, this dome-shaped connector would be likely to have less chance of getting cracks in the ceramic materials especially in vertex areas.

When positioned inside the ceramic material, the ceramic material along with a portion of the dome-shaped electrode connector (320). The chance of cracks in the ceramic material would be higher especially in the sharp areas such as edges or vertices. The dome-shape of the electrode connector would remove some of the sharp edges and vertices so that the probability of getting cracks would be reduced even during the drilling out. This drill out would flatten the electrode connector on the contact surface 231 shown in FIG. 2 (*b*) and would make an area for a rod.

After drilling out, a rod would be attached to the drilled-out, flat area of the electrode connector (330). This bond would be stronger since the rod may be well within the flattened, bonding area so that the resulting bonding force would be strong, and the large area would reduce the resulting impedance when heating may be on.

The length of the bonding area in FIG. 2 (*a*) would be usually 3 mm in the prior art. And increasing the length would mean much higher probability of getting cracked.

With the method presented in the present disclosure, the length of the bonding area 231 could be increased up to 5 mm or more which could be important in that the rod 221 could well be fit within the electrode connector 211.

Figure 4:
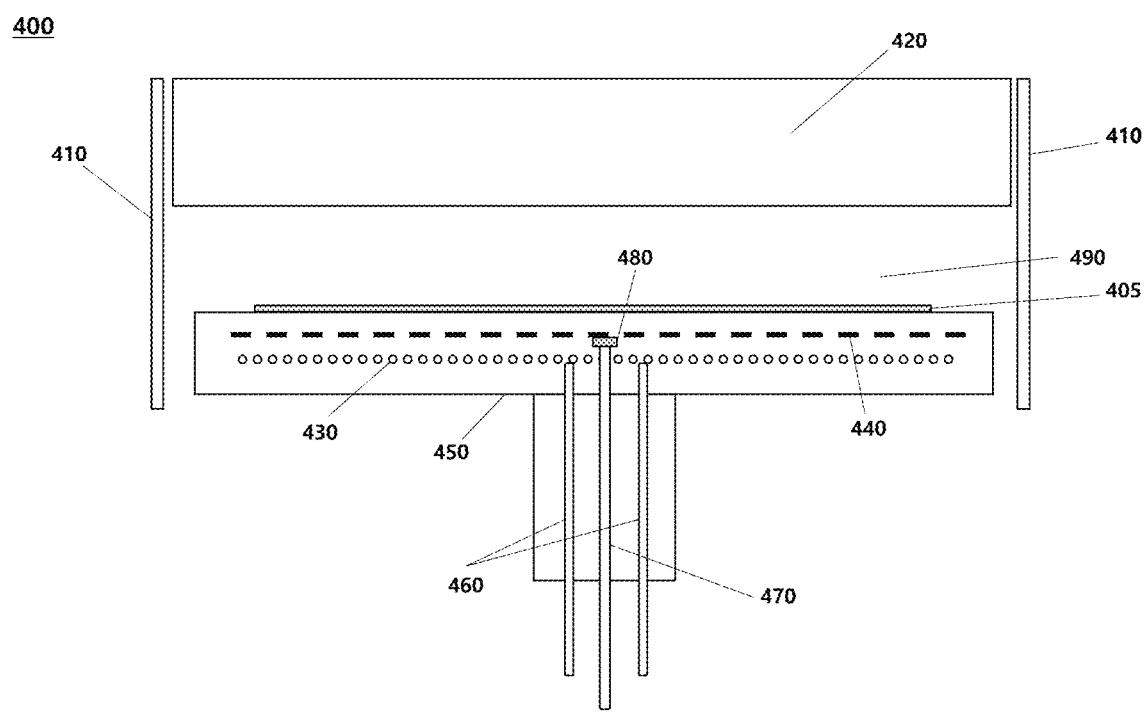
FIG. 4 illustrates a substrate processing apparatus according to an embodiment of the present disclosure.

FIG. 4 illustrates a substrate processing apparatus according to an embodiment of the present disclosure.

The substrate processing apparatus 400 may comprise a wall surrounding a space 490 which may be used to process a substrate 405. The substrate processing apparatus 400 may also comprise a showerhead 420 which may be used to generate plasma and to disperse gas for processing the substrate 405. The substrate processing apparatus 400 may also comprise a susceptor 450 which may be used to support a substrate 405.

The susceptor 450 may comprise a plurality of radio frequency (RF) meshes 440 and a plurality of heating elements 430. The susceptor 450 may also comprise rods 460, 470 and electrode 480. The rods may comprise a heating rod 460 and an RF rod 470.

In general, the showerhead 420 may be used as an upper electrode and a lower electrode 480 may be installed in the susceptor for generating plasma. The electrode 480 may be used as an electrode connector 480 that is connected to a rod. The rod connected to the electrode connector 480 may be an RF rod.

As described earlier, the rod 470 connected to the electrode (connector) 480 and the width (or diameter if the electrode may be circle-shaped) of the electrode 480 may be larger than the diameter of the rod 470 so that the rod 470 may be attached firmly to the electrode 480.

The above-described arrangement of method is merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. A method of providing a stable connector that connects a heating element to a rod in a deposition apparatus, the method comprising:

forming a dome-shaped electrode connector inside of a ceramic material;

drilling out a part of the ceramic material along with a portion of the dome-shaped electrode connector to flatten the electrode connector; and bonding a rod into a remaining part of the electrode connector.

2. The method according to claim 1, wherein
the length of the dome-shaped electrode connector is equal to or bigger than 5 mm.

3. The method according to claim 1, wherein
the width of the rod is equal to or less than the length of the dome-shaped electrode connector.

4. A substrate processing apparatus with a stable electrode connecting space for connecting an electrode and a rod, the apparatus comprising:

a chamber defined by a wall surrounding the chamber;

a showerhead disposed on upside of the chamber;

a susceptor configured to support a substrate, the susceptor comprising a plurality of radio frequency (RF) meshes, a plurality of heating elements, a rod and an electrode connector, wherein the rod is connected to the electrode connector and the width of the electrode connector is larger than the diameter of the rod.

5. The substrate processing apparatus according to the claim 4, wherein the rod comprising a heating rod and an RF rod.

6. The substrate processing apparatus according to the claim 5, wherein the RF rod is connected to the electrode connector.

7. The substrate processing apparatus according to the claim 4, wherein the electrode connector is manufactured with a method defined by claim 1.

\* \* \* \* \*